(12) United States Patent
Cho

(10) Patent No.: US 11,923,389 B2
(45) Date of Patent: Mar. 5, 2024

(54) IMAGE SENSING DEVICE

(71) Applicant: SK hynix Inc., Icheon-si (KR)

(72) Inventor: Sung Wook Cho, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 352 days.

(21) Appl. No.: 17/225,656

(22) Filed: Apr. 8, 2021

(65) Prior Publication Data

US 2022/0077211 A1     Mar. 10, 2022

(30) Foreign Application Priority Data

Sep. 8, 2020   (KR) .......................... 10-2020-0114554

(51) Int. Cl.
*H01L 27/146*     (2006.01)

(52) U.S. Cl.
CPC .. *H01L 27/14621* (2013.01); *H01L 27/14645* (2013.01); *H01L 27/14627* (2013.01)

(58) Field of Classification Search
CPC ......... H01L 27/14621; H01L 27/14645; H01L 27/14627; H01L 27/1462; H01L 27/14625; H01L 27/14632; H01L 27/14603
See application file for complete search history.

(56) References Cited

U.S. PATENT DOCUMENTS

| 2011/0205410 A1* | 8/2011 | Ahn ....................... H04N 23/12 |
| | | 348/E5.091 |
| 2014/0327798 A1* | 11/2014 | Takakusagi ....... H01L 27/14685 |
| | | 348/273 |
| 2018/0006077 A1* | 1/2018 | Lee ...................... H04N 25/702 |

FOREIGN PATENT DOCUMENTS

| KR | 100660714 B1 | 12/2006 |
| KR | 102066603 B1 | 1/2020 |

* cited by examiner

*Primary Examiner* — Shih Tsun A Chou
(74) *Attorney, Agent, or Firm* — Perkins Coie LLP

(57) ABSTRACT

An image sensing device includes photoelectric conversion elements structured to convert light into electrical signals, and a color filter layer structured to filter incident light towards the photoelectric conversion elements depending on a wavelength range of the incident light corresponding to colors of the incident light to allow the filtered light to be detected by the photoelectric conversion elements corresponding to the colors of the incident light. The color filter layer includes a plurality of first color filters as part of the different filters and structured to allow light at a wavelength range corresponding to a first color and arranged adjacent to each other. A distance between at least one of the first color filters and a corresponding photoelectric conversion element formed below the at least one of the first color filters is different from a distance between the remaining first color filters and corresponding photoelectric conversion elements, respectively.

20 Claims, 9 Drawing Sheets

IMAGE SENSING DEVICE

CROSS-REFERENCE TO RELATED APPLICATION

This patent document claims the priority and benefits of Korean patent application No. 10-2020-0114554, filed on Sep. 8, 2020, which is incorporated by reference in its entirety as part of the disclosure of this patent document.

TECHNICAL FIELD

The technology and implementations disclosed in this patent document generally relate to an image sensing device.

BACKGROUND

An image sensing device is used in electronic devices to convert optical images into electrical signals. With the recent development of automotive, medical, computer and communication industries, the demand for highly integrated, higher-performance image sensors has been rapidly increasing in various electronic devices such as digital cameras, camcorders, personal communication systems (PCSs), video game consoles, surveillance cameras, medical micro-cameras, robots, etc.

SUMMARY

Various embodiments of the disclosed technology relate to an image sensing device capable of acquiring both long-exposure pixel signals and normal pixel signals using only one exposure.

In an embodiment of the disclosed technology, an image sensing device may include a semiconductor substrate, a plurality of photoelectric conversion elements supported by the semiconductor substrate and structured to convert light into electrical signals, and a color filter layer disposed over the semiconductor substrate and structured to include different filters which filter incident light towards the photoelectric conversion elements depending on a wavelength range of the incident light corresponding to colors of the incident light to allow the filtered light to be detected by the photoelectric conversion elements corresponding to the colors of the incident light. The color filter layer may include a plurality of first color filters as part of the different filters and structured to allow light at a wavelength range corresponding to a first color and arranged adjacent to each other. A distance between at least one of the first color filters and a corresponding photoelectric conversion element formed below the at least one of the first color filters is different from a distance between the remaining first color filters and corresponding photoelectric conversion elements, respectively In another embodiment of the disclosed technology, an image sensing device may include a first sub-pixel block including a plurality of unit pixels arranged adjacent to each other and structured to convert light at a wavelength range corresponding to a first color to electrical signals, a second sub-pixel block including a plurality of unit pixels arranged adjacent to each other and structured to convert light at a wavelength range corresponding to a second color to electrical signals, and a third sub-pixel block including a plurality of unit pixels arranged adjacent to each other and structured to convert light at a wavelength range corresponding to a third color to electrical signals. Each of the first to third sub-pixel blocks include at least one unit pixel that includes a photoelectric conversion element spaced apart from a corresponding color filter at a first distance and remaining unit pixels that include photoelectric conversion elements spaced apart from corresponding color filters at a second distance, and wherein the first distance is different from the second distance.

In another embodiment of the disclosed technology, an image sensing device may include a semiconductor substrate including a plurality of photoelectric conversion elements configured to convert light into electrical signals, and a color filter layer disposed over a first surface of the semiconductor substrate, and configured to filter incident light depending on colors of the incident light and to transmit the filtered light to the photoelectric conversion elements corresponding to the colors of the incident light. The color filter layer may include a plurality of first color filters arranged adjacent to each other while having a first color. The color filter layer may include a plurality of first color filters arranged adjacent to each other while having a first color. The semiconductor substrate may be formed in a manner that a region in which at least one first color filter from among the first color filters is disposed and a region in which the remaining first color filters other than the at least one first color filter are disposed have different thicknesses from each other.

In another embodiment of the disclosed technology, an image sensing device may include a first sub-pixel block in which a plurality of unit pixels configured to generate electrical signals through conversion of light having a first color is arranged adjacent to each other, a second sub-pixel block in which a plurality of unit pixels configured to generate electrical signals through conversion of light having a second color is arranged adjacent to each other, and a third sub-pixel block in which a plurality of unit pixels configured to generate electrical signals through conversion of light having a third color is arranged adjacent to each other. In each of the first to third sub-pixel blocks, a thickness of the semiconductor substrate in which at least one unit pixel is disposed may be different from a thickness of the semiconductor substrate in which the remaining unit pixels other than the at least one unit pixel are disposed.

It is to be understood that both the foregoing general description and the following detailed description of the disclosed technology are illustrative and explanatory and are intended to provide further explanation of the disclosure as claimed.

DETAILED DESCRIPTION

This patent document provides implementations and examples of an image sensing device and the disclosed features may be implemented to achieve one or more advantages in imaging applications. Some implementations of the disclosed technology suggest designs of an image sensing device which can acquire both long-exposure pixel signals and normal pixel signals using only one exposure.

Figure 1:
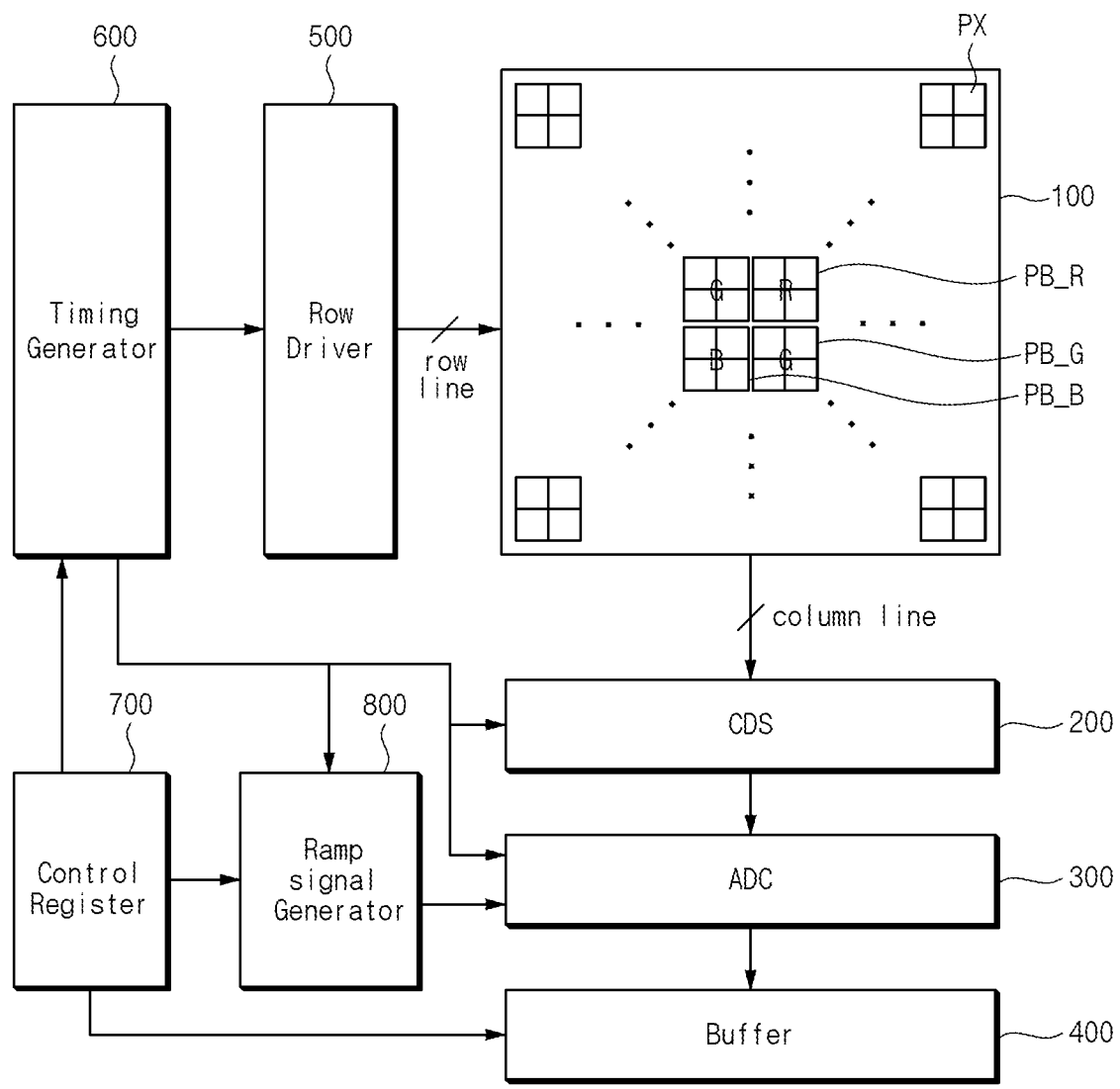
FIG. 1 is a schematic diagram illustrating an example layout of an image sensing device based on some implementations of the disclosed technology.
Figure 2:
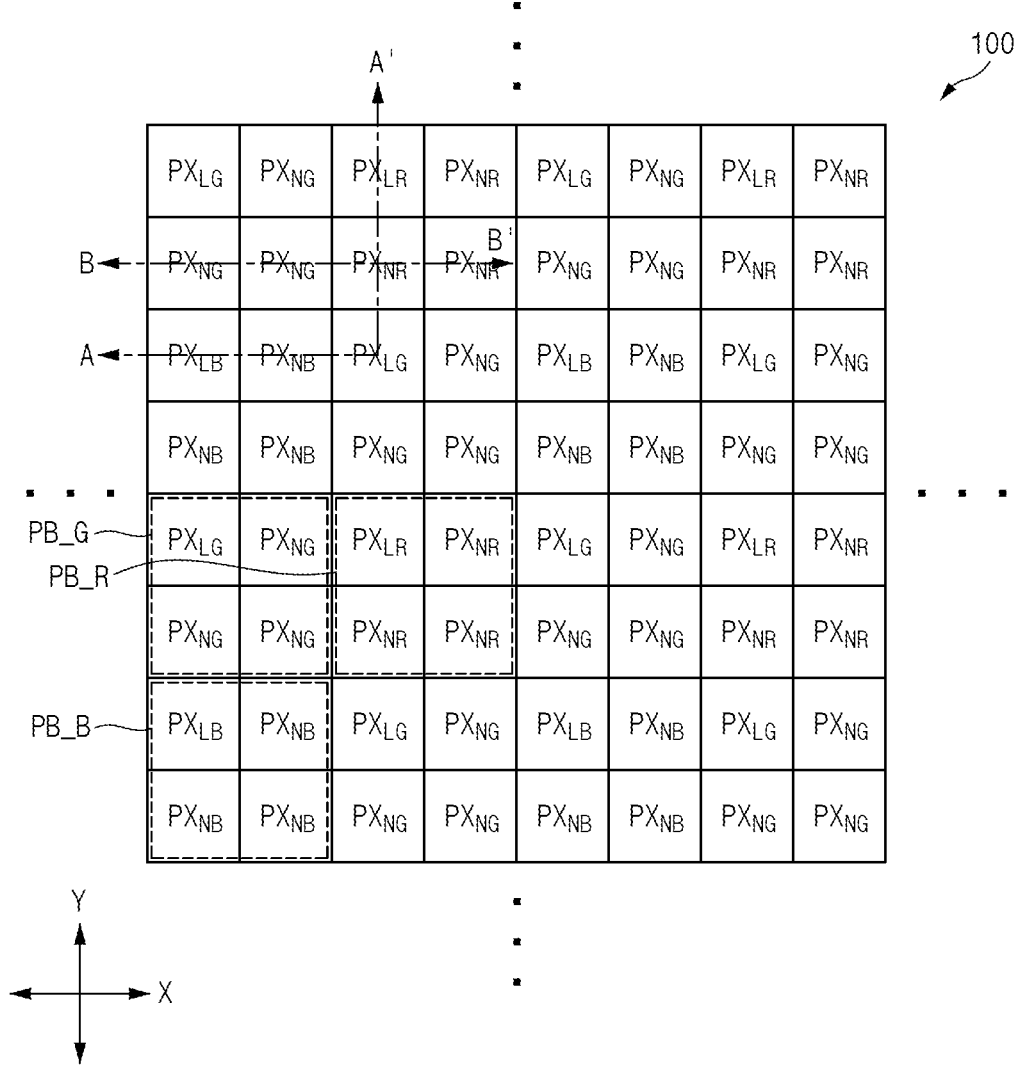
FIG. 2 is a schematic diagram illustrating an example layout of a pixel array shown in FIG. 1 based on some implementations of the disclosed technology.

FIG. 1 is a block diagram illustrating an example of an image sensing device based on some implementations of the disclosed technology. FIG. 2 is a schematic diagram illustrating an example layout of a pixel array 100 shown in FIG. 1 based on some implementations of the disclosed technology.

Referring to FIGS. 1 and 2, the image sensing device may include a pixel array 100, a correlated double sampler (CDS) 200, an analog-to-digital converter (ADC) 300, a buffer 400, a row driver 500, a timing generator 600, a control register 700, and a ramp signal generator 800.

The pixel array 100 may include a plurality of sub-pixel blocks PB_R, PB_G, and PB_B consecutively arranged in a two-dimensional (2D) structure in which the sub-pixel blocks are arranged in row and column directions. Each of the sub-pixel blocks PB_R, PB_G, and PB_B may include a plurality of unit pixels (PXs) configured to generate an electrical signal (i.e., pixel signal) corresponding to incident light through photoelectric conversion of the incident light received from the outside. In this case, each of the sub-pixel blocks PB_R, PB_G, and PB_B may include a structure in which the unit pixels (PXs) having colors filters of the same color are arranged adjacent to each other in an (N×N) array (where, 'N' is a natural number of 2 or greater). In FIGS. 1 and 2, the pixel array 100 may include the sub-pixel blocks PB_R, PB_G, and PB_B, each of which has a quad structure in which four unit pixels having the same color are arranged in a (2×2) array. In some implementations, the sub-pixel block PB_R may include a structure in which four red color pixels having red color filters configured to selectively transmit visible light at a first wavelength band while blocking light at other wavelength bands are arranged in a (2×2) array. The sub-pixel block PB_G may include a structure in which four green color pixels having green color filters configured to selectively transmit visible light at a second wavelength band shorter than the first wavelength band while blocking light at other wavelength bands are arranged in a (2×2) array. The sub-pixel block PB_B may include a structure in which four blue color pixels having blue color filters configured to selectively transmit visible light at a third wavelength band shorter than the second wavelength band while blocking light at other wavelength bands are arranged in a (2×2) array. The sub-pixel blocks PB_R, PB_G, and PB_B may be consecutively and regularly arranged in a Bayer pattern.

Each sub-pixel block PB_R, PB_G, or PB_B may include non-normal pixels such as long-exposure pixels $PX_{LR}$, $PX_{LG}$, or $PX_{LB}$ In some implementations, each sub-pixel block PB_R, PB_G, or PB_B may include a long-exposure pixel $PX_{LR}$, $PX_{LG}$, or $PX_{LB}$ for implementing a high dynamic range (HDR). In more detail, the sub-pixel block PB_R may include a long-exposure pixel ($PX_{LR}$) for HDR implementation. The sub-pixel block PB_G may include a long-exposure pixel ($PX_{LG}$) for HDR implementation. The sub-pixel block PB_B may include a long-exposure pixel ($PX_{LB}$) for HDR implementation. In the following description, the remaining unit pixels other than the long-exposure pixels $PX_{LR}$, $PX_{LG}$, and $PX_{LB}$ in the sub-pixel block PB_R, PB_G and PB_B will hereinafter be defined as normal pixels $PX_{NR}$, $PX_{NG}$, and $PX_{NB}$. In more detail, the remaining unit pixels other than the long-exposure pixel ($PX_{LR}$) in a (2×2) array will hereinafter be defined as normal pixels ($PX_{NR}$), the remaining unit pixels other than the long-exposure pixel ($PX_{LG}$) in a (2×2) array will hereinafter be defined as normal pixels ($PX_{NG}$), and the remaining unit pixels other than the long-exposure pixel ($PX_{LB}$) in a (2×2) array will hereinafter be defined as normal pixels ($PX_{NB}$). The long-exposure pixels $PX_{LR}$, $PX_{LG}$, and $PX_{LB}$ may refer to pixels that are formed such that the photoelectric conversion elements of the long-exposure pixels $PX_{LR}$, $PX_{LG}$, and $PX_{LB}$ can be saturated rapidly in a duration shorter than an exposure time used for exposing the normal pixels $PX_{NR}$, $PX_{NG}$, and $PX_{NG}$ to the incident light in sensing the incident light for imaging. Thus, although the pixel array 100 is exposed only once (e.g., the same exposure time for long-exposure pixels and normal pixels), the pixel array 100 can generate two types of pixel signals: (1) over-exposed pixel signals or long-exposure pixel signals from long-exposure pixels with a saturated photoelectric conversion element, and (2) normal pixel signals from normal pixels with a non-saturated photoelectric conversion element during the exposure time.

To this end, a photoelectric conversion element of the long-exposure pixel ($PX_{LR}$) may be different in size (or volume) from each of photoelectric conversion elements of the normal pixels ($PX_{NR}$), a photoelectric conversion element of the long-exposure pixel ($PX_{LG}$) may be different in size (or volume) from each of photoelectric conversion elements of the normal pixels ($PX_{NG}$), and a photoelectric conversion element of the long-exposure pixels ($PX_{LB}$) may be different in size (or volume) from each of photoelectric conversion elements of the normal pixels ($PX_{NB}$). In addition, the photoelectric conversion elements of the long-exposure pixels $PX_{LR}$, $PX_{LG}$, and $PX_{LB}$ may be formed to have different sizes depending on colors of the corresponding pixels. A detailed description of the long-exposure pixels $PX_{LR}$, $PX_{LG}$, and $PX_{LB}$ will be given at a later time.

As discussed above, each unit pixel PX may output the pixel signal to the correlated double sampler (CDS) 200. CMOS image sensors may use the correlated double sampling (CDS) to remove an undesired offset value of pixels by sampling a pixel signal twice to remove the difference between these two samples. In one example, the correlated double sampling (CDS) may remove the undesired offset value of pixels by comparing pixel output voltages obtained before and after a light signal is incident on the pixels so that only pixel output voltages based on the incident light can be measured. In some embodiments of the disclosed technology, the correlated double sampler (CDS) 200 may sequentially sample and hold voltage levels of the reference signal and the image signal, which are provided to each of a plurality of column lines from the pixel array 100. For example, the correlated double sampler (CDS) 200 may perform sampling of a reference voltage level and a voltage level of the received pixel signal in response to a clock signal received from the timing generator 600, and may transmit an analog signal corresponding to a difference between the reference voltage level and the voltage level of the received pixel signal to the analog-to-digital converter (ADC) 300.

The analog-to-digital converter (ADC) 300 may be used to convert analog CDS signals to digital signals. In some implementations, the ADC 300 may be implemented as a ramp-compare type ADC. The ramp-compare type ADC may include a comparator circuit for comparing the analog pixel signal with a reference signal such as a ramp signal that ramps up or down, and a timer counts until a voltage of the ramp signal matches the analog pixel signal. In some embodiments of the disclosed technology, the ADC 300 may convert the correlate double sampling signal generated by the CDS 200 for each of the columns into a digital signal, and output the digital signal. The ADC 300 may perform a counting operation and a computing operation based on the correlate double sampling signal for each of the columns and a ramp signal received from the ramp signal generator 800. In this way, the ADC 300 may eliminate or reduce noises such as reset noise arising from the imaging pixels when generating digital image data.

The ADC 300 may include a plurality of column counters. Each column of the pixel array 100 is coupled to a column counter, and image data can be generated by converting the correlate double sampling signals received from each column into digital signals using the column counter. In another embodiment of the disclosed technology, the ADC 300 may include a global counter to convert the correlate double sampling signals corresponding to the columns into digital signals using a global code provided from the global counter.

The buffer 400 may temporarily hold or latch each of the digital signals received from the analog-to-digital converter (ADC) 300, may sense or detect and amplify each of the digital signals, and may output each of the amplified digital signals. Therefore, the buffer 400 may include a memory (not shown) and a sense amplifier (not shown). The memory may store the count value, and the count value may be associated with output signals of the plurality of unit pixels PXs. The sense amplifier may sense and amplify each count value received from the memory.

The row driver 500 may be used to drive the pixel array 100 in response to an output signal of the timing generator 600. In some implementations, the row driver 500 may select one or more imaging pixels arranged in one or more rows of the pixel array 100. The row driver 500 may generate a row selection signal to select one or more rows among the plurality of rows. The row decoder 500 may sequentially enable the pixel reset signal for resetting imaging pixels corresponding to at least one selected row, and the transmission signal for the pixels corresponding to the at least one selected row.

The timing generator 600 may generate a timing signal to control the row driver 500, the correlated double sampler (CDS) 200, the analog-to-digital converter (ADC) 300, and the ramp signal generator 800.

The control register 700 may generate control signals to control the ramp signal generator 800, the timing generator 600, and the buffer 400.

The ramp signal generator 800 may generate a ramp signal in response to a control signal of the control register 700 and a timing signal received from the timing generator 600, and may output the ramp signal to the analog-to-digital converter (ADC) 300.

Referring to FIG. 2, a pixel array 100 includes a plurality of sub-pixel blocks PB_R, PB_G, and PB_B, each of which includes a plurality of unit pixels (PX). In one implementation, each sub-pixel block PB_R may include one long-exposure pixel ($PX_{LR}$), each sub-pixel block PB_G may include one long-exposure pixel ($PX_{LG}$), and each sub-pixel block PB_B may include one long-exposure pixel ($PX_{LB}$). In another implementation, each of the sub-pixel blocks PB_R, PB_G, and PB_B may include a plurality of long-exposure pixels. In some implementations, the degree of exposure to light applied to an image sensing device can be altered by increasing or decreasing the time of each exposure. For example, in an HDR imaging, exposure variation may be done by altering the exposure time. In some embodiments of the disclosed technology, each sub-pixel block in a pixel array may include at least one long-exposure pixel, and such a long-exposure pixel may be implemented by varying the thicknesses of the layers arranged under the color filter layer. Although FIG. 2 illustrates each of the sub-pixel blocks PB_R, PB_G, and PB_B as including one long-exposure pixel (i.e., the long-exposure pixels $PX_{LR}$, $PX_{LG}$, and $PX_{LB}$, respectively), the scope of the disclosed technology is not limited thereto. In another example implementation, one sub-pixel block (or two sub-pixel blocks) selected between the sub-pixel blocks PB_R, PB_G, and PB_B may include such a long-exposure pixel $PX_{LR}$, $PX_{LG}$, or $PX_{LB}$. Although FIG. 2 illustrates the long-exposure pixels $PX_{LR}$, $PX_{LG}$, or $PX_{LB}$ as being formed at the same positions in the sub-pixel blocks PB_R, PB_G, or PB_B, the positions of the long-exposure pixels $PX_{LR}$, $PX_{LG}$, and $PX_{LB}$ in the sub-pixel blocks PB_R, PB_G, and PB_B may vary in other implementations of the disclosed technology.

Figure 3A:
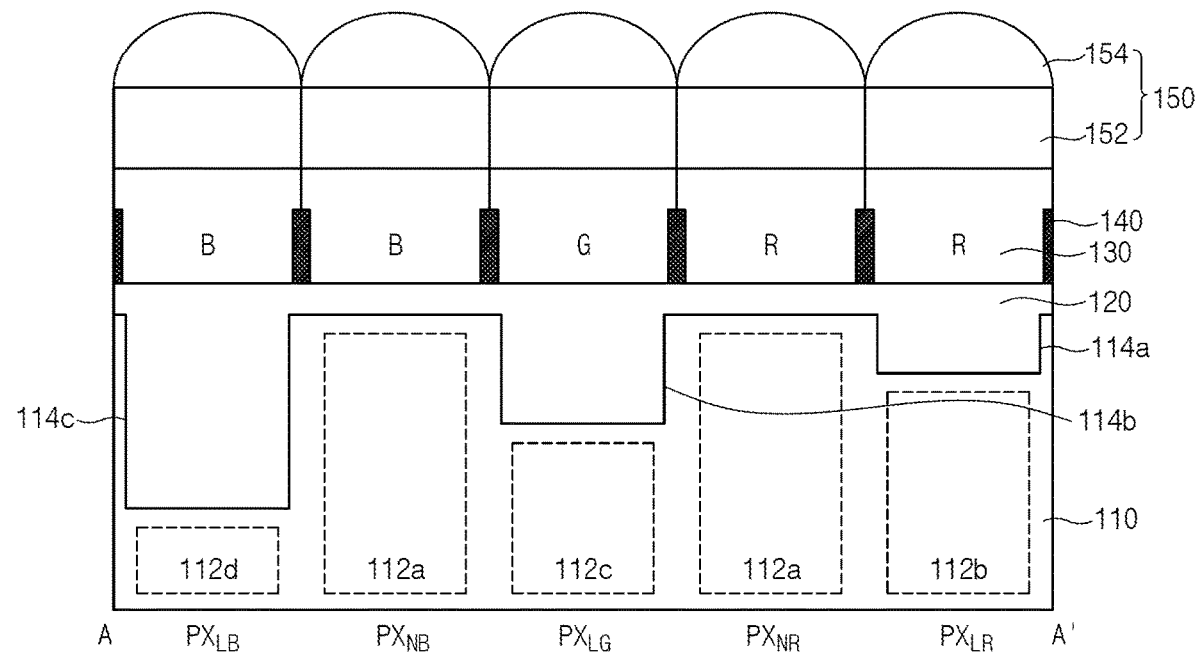
FIG. 3A is a cross-sectional view illustrating an example of a pixel array taken along the line A-A' shown in FIG. 2 based on some implementations of the disclosed technology.
Figure 3B:
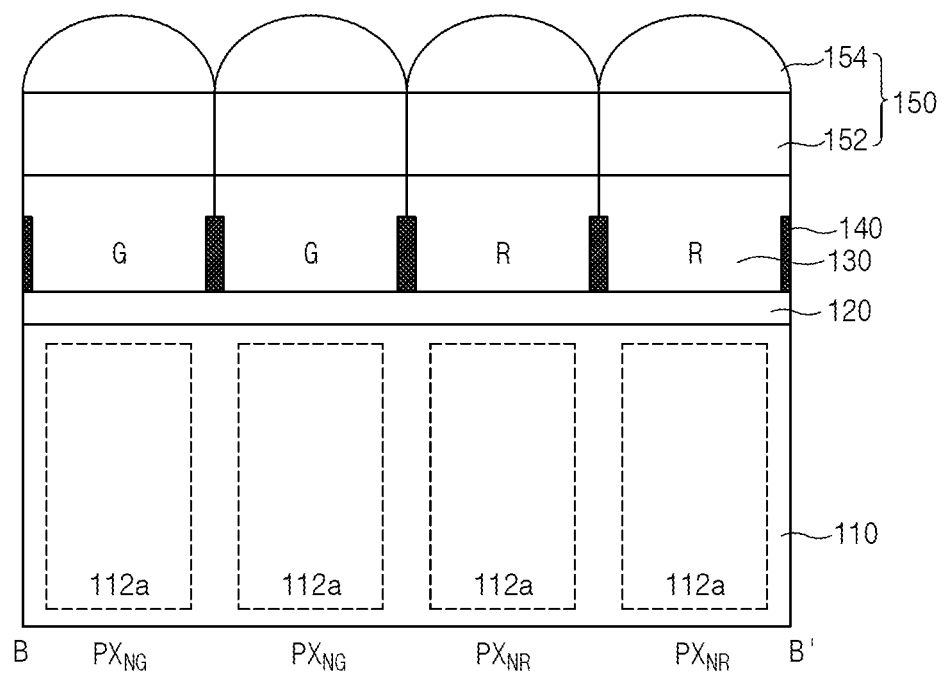
FIG. 3B is a cross-sectional view illustrating an example of the pixel array taken along the line B-B' shown in FIG. 2 based on some implementations of the disclosed technology.

FIG. 3A is a cross-sectional view illustrating an example of the pixel array 100 taken along the line A-A' shown in FIG. 2 based on some implementations of the disclosed technology. FIG. 3B is a cross-sectional view illustrating an example of the pixel array 100 taken along the line B-B' shown in FIG. 2 based on some implementations of the disclosed technology.

In some embodiments of the disclosed technology, each sub-pixel block in a pixel array may include a plurality of pixels such that a long-exposure pixel includes material layers and photoelectric conversion elements that are different from other pixels such as normal pixels. In one example, the long-exposure pixel may include an anti-reflection layer and/or a silicon layer formed under a color filter and having a thickness different from other anti-reflection layers and/or silicon layer formed under other pixels such as normal pixels. In one example, the long-exposure pixel may include a photoelectric conversion element that is smaller than photoelectric conversion element of other pixels such as normal pixels. In one example, the long-exposure pixel may be formed such that a distance between a long-exposure photoelectric conversion element and its corresponding color filter is longer than a distance between a normal photoelectric conversion element and its corresponding color filter. Referring to FIGS. 3A and 3B, a semiconductor substrate 110 may include a first surface and a second surface facing away from each other. The semiconductor substrate 110 may include a monocrystalline material layer. For example, the semiconductor substrate 110 may include a material layer that includes silicon. In some implementations, the semiconductor substrate 110 may include a monocrystalline silicon layer. The semiconductor substrate 110 may include a plurality of photoelectric conversion elements. As illustrated in FIGS. 3A and 3B, each unit pixel PX is one of photoelectric conversion elements 112a, 112b, 112c, and 112d. The photoelectric conversion elements 112a, 112b, 112c, and 112d may convert incident light (e.g., visible light) filtered by a color filter layer 130 to electrical signals.

The semiconductor substrate 110 in the corresponding pixels are formed to have different thicknesses depending on the types and colors of the corresponding pixels. For example, in each sub-pixel block PB_R, PB_G, or PB_B, a region in which the long-exposure pixel $PX_{LR}$, $PX_{LG}$, or $PX_{LB}$ is formed and a region in which the normal pixels $PX_{NR}$, $PX_{NG}$, or $PX_{NB}$ are formed may have different thicknesses from each other. In more detail, in the sub-pixel block PB_R, a first region in which the long-exposure pixel ($PX_{LR}$) is formed and a second region in which the normal pixels ($PX_{NR}$) are formed may have different thicknesses from each other. In the sub-pixel block PB_G, a third region in which the long-exposure pixel ($PX_{LG}$) is formed and a fourth region in which the normal pixels ($PX_{NG}$) are formed may have different thicknesses from each other. In the sub-pixel block PB_B, a fifth region in which the long-exposure pixel ($PX_{LB}$) is formed and a sixth region in which the normal pixels ($PX_{NB}$) are formed may have different thicknesses from each other. Here, the first, third and fifth regions in which the long-exposure pixels $PX_{LR}$, $PX_{LG}$, $PX_{LB}$ are formed have a smaller depth than the region in which the normal pixels $PX_{NR}$, $PX_{NG}$, or $PX_{NB}$ are formed. In one example, the long-exposure pixel $PX_{LR}$, $PX_{LG}$, $PX_{LB}$ may be formed such that a distance between its long-exposure photoelectric conversion element and color filter is longer than a distance between a normal photoelectric conversion element and its corresponding color filter.

As described above, since the portion of the semiconductor substrate 110 arranged between a color filter and a photoelectric conversion element corresponding to the long-exposure pixel $PX_{LR}$, $PX_{LG}$, or $PX_{LB}$ has a greater depth than those of the normal pixels $PX_{NR}$, $PX_{NG}$, or $PX_{NB}$, the photoelectric conversion element 112b, 112c, or 112d of the long-exposure pixel $PX_{LR}$, $PX_{LG}$, or $PX_{LB}$ may be smaller in size than each of the photoelectric conversion elements 112a of the normal pixels $PX_{NR}$, $PX_{NG}$, or $PX_{NB}$. Therefore, during the same exposure time, the photoelectric conversion elements 112b, 112c, and 112d of the long-exposure pixels $PX_{LR}$, $PX_{LG}$, and $PX_{LB}$ may be saturated faster than the photoelectric conversion elements 112a of the normal pixels $PX_{NR}$, $PX_{NG}$, and $PX_{NB}$.

The long-exposure pixels $PX_{LR}$, $PX_{LG}$, and $PX_{LB}$ receive visible light at different wavelength bands depending on colors of the corresponding pixels, and thus, the long-exposure pixel $PX_{LR}$, $PX_{LG}$, $PX_{LB}$ may be formed such that the distance between its long-exposure photoelectric conversion element and color filter can vary depending on the wavelength bands, which is corresponding to the colors of the pixels. If the portion of the semiconductor substrate 110 corresponding to the long-exposure pixel $PX_{LR}$, $PX_{LG}$, $PX_{LB}$ have the same thickness regardless of their corresponding wavelength bands (color), the amount of light absorbed by the photoelectric conversion elements 112b, 112c, and 112d can vary depending on the colors of the corresponding pixels. Therefore, the substrate of the long-exposure pixel $PX_{LR}$, $PX_{LG}$, or $PX_{LB}$ is formed to be thinner than the substrate of the normal pixel $PX_{NR}$, $PX_{NG}$, or $PX_{NB}$, and the thickness of the substrate of the long-exposure pixels $PX_{LR}$, $PX_{LG}$, or $PX_{LB}$ may be formed differently according to colors of the long-exposure pixels $PX_{LR}$, $PX_{LG}$, and $PX_{LB}$.

For example, the portion of the substrate corresponding to the long-exposure pixel $PX_{LR}$ including a red color filter and structured to convert red visible light having a first wavelength band may be formed to be thicker than the portion of the substrate corresponding to the long-exposure pixel $PX_{LG}$ including a green color filter and structured to convert green visible light having a second wavelength band shorter than the first wavelength band. In addition, the portion of the substrate corresponding to the long-exposure pixel $PX_{LG}$ including a green color filter may be formed to be thicker than the portion of the substrate corresponding to the long-exposure pixel $PX_{LB}$ including a blue color filter and structured to convert blue visible light having a third wavelength band shorter than the second wavelength band. Accordingly, the distance between the photoelectric conversion element 112b of the long-exposure pixel $PX_{LR}$ and the corresponding red color filter may be closer than the distance between the photoelectric conversion element 112c of the long-exposure pixel $PX_{LG}$ and the corresponding green color filter. In some implementations, the photoelectric conversion element 112b of the long-exposure pixel $PX_{LR}$ including the red color filter may have a larger size (volume) than the photoelectric conversion element 112c of the long-exposure pixel $PX_{LG}$ including the green color filter. In addition, the distance between the photoelectric conversion element 112c of the long-exposure pixel $PX_{LG}$ and the corresponding green color filter may closer than the distance between the photoelectric conversion element 112d of the long-exposure pixel $PX_{LB}$ and the corresponding blue color filter. In some implementations, the photoelectric conversion element 112c of the long-exposure pixel $PX_{LG}$ including the green color filter may have a larger size (volume) the photoelectric conversion element 112d of the long-exposure pixel $PX_{LB}$ including the blue color filter.

In order to form the portions of the semiconductor substrate 110 having different thicknesses as described above, trenches 114a, 114b, and 114c having different depths may be respectively formed in substrate regions in which the long-exposure pixels $PX_{LR}$, $PX_{LG}$, and $PX_{LB}$ are formed. By adjusting the depths of the trenches 114a, 114b, and 114c, the semiconductor substrate 110 of the long-exposure pixel $PX_{LR}$, the semiconductor substrate 110 of the long-exposure pixel $PX_{LG}$, and the semiconductor substrate 110 of the long-exposure pixel $PX_{LB}$ may have different thicknesses from each other.

In some implementations, an anti-reflection layer 120 may be formed over the first surface of the semiconductor substrate 110 in the trenches 114a, 114b, and 114c. In one example, the anti-reflection layer 120 may include a monolayer structure formed of at least one of a group consisting of an oxide film, a nitride film, and an oxynitride film. In another example, the anti-reflection layer 120 may include a multilayer structure formed by stacking at least two of the oxide film, the nitride film, and the oxynitride film.

The color filter layer 130 may be formed over the anti-reflection layer 120. The color filter layer 130 may include a plurality of color filters (i.e., RGB filters), each of which is formed to selectively filter only visible light having wavelengths corresponding to a specific color so that the filtered light is fed to the corresponding photoelectric conversion elements 112a, 112b, 112c, and 112d. In more detail, the color filter layer 130 including a plurality of red color filters (Rs), a plurality of green color filters (Gs), and a plurality of blue color filters (Bs) may filter incident light, and visible light (e.g., red light, green light, or blue light) at a certain wavelength is fed to the corresponding photoelectric conversion elements 112a, 112b, 112c, and 112d while blocking light at other wavelengths. Each red color filter (R) allows red visible light having a first wavelength band to pass through. Each green color filter (G) allows green visible light having a second wavelength band to pass through. Each blue color filter (B) allows blue visible light having a third wavelength band to pass through. Each unit pixel (PX) includes one of the color filters R, G, and B. The red color filter (R) may include a polymer organic material including a red pigment, the green color filters (G) may include a polymer organic material including a green pigment, and the blue color filter (B) may include a polymer organic material including a blue pigment. For example, each of the color filters R, G, and B may include a resist material.

The grid structure 140 may define regions in which the color filters R, G, and B are formed, and may be formed between the color filters R, G, and B, thereby preventing crosstalk between the color filters R, G, and B adjacent to each other. In some implementations, an area (i.e., an aperture area) of the region defined by the grid structure 140 is the same for both the long-exposure pixels ($PX_{LR}$, $PX_{LG}$, $PX_{LB}$) and the normal pixels ($PX_{NR}$, $PX_{NG}$, $PX_{NB}$).

The lens layer 150 may include an over-coating layer 152 and a plurality of microlenses 154. In some implementations, the over-coating layer 152 and the microlenses 154 may be formed of the same materials. The over-coating layer 152 may be formed over the color filter layer 130. The over-coating layer 152 may be used to planarize an uneven surface after forming the color filter layer 130. The microlenses 154 may be formed over the over-coating layer 152. Each of the microlenses 154 may be formed in a hemispherical shape and may be formed over each corresponding unit pixel (PX). The microlenses 154 may converge incident light onto the corresponding color filters R, G, and B.

Figure 4A:
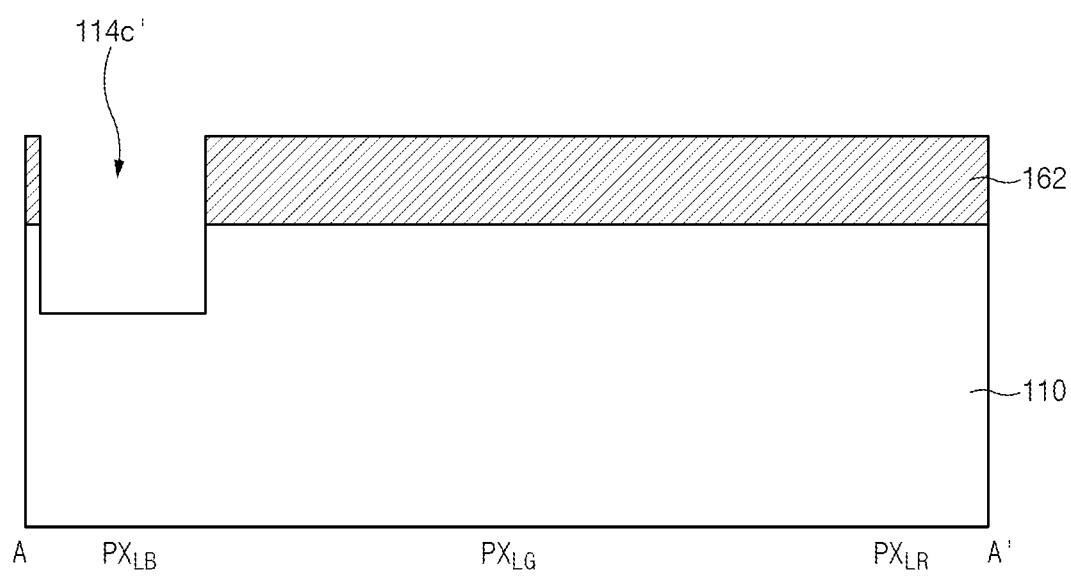
FIGS. 4A to 4C are cross-sectional views illustrating examples of a method for forming trenches having different depths shown in FIG. 3A based on some implementations of the disclosed technology.
Figure 4B:
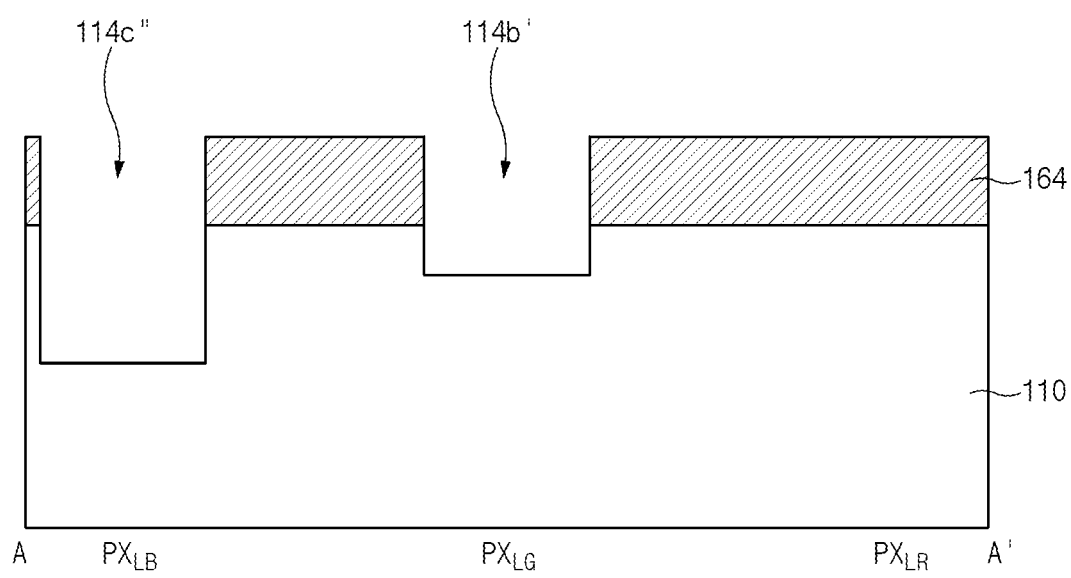
Figure 4C:
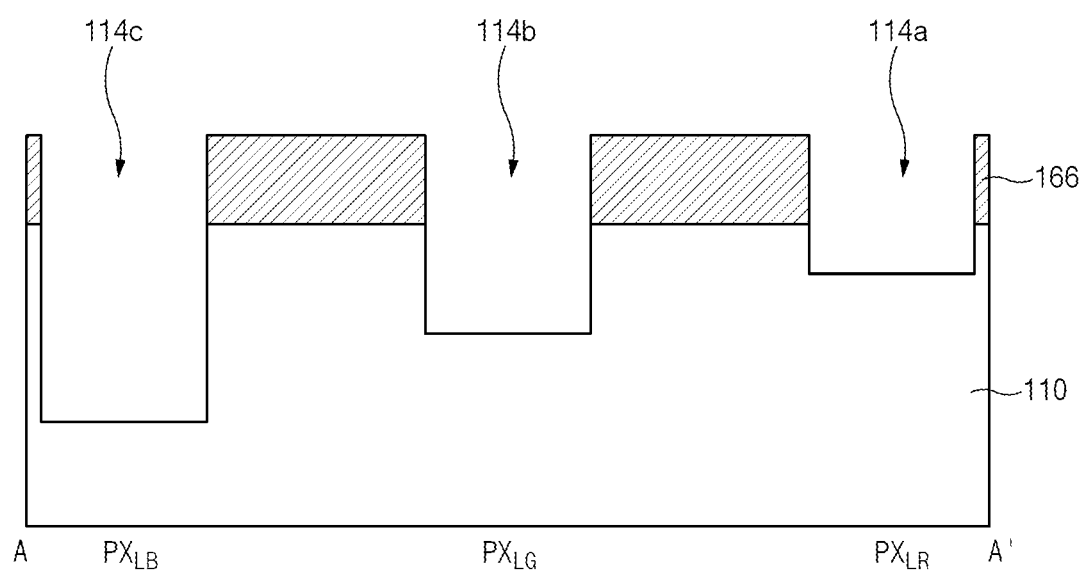

FIGS. 4A to 4C are cross-sectional views illustrating examples of a method for forming trenches having different depths shown in FIG. 3A based on some implementations of the disclosed technology.

Referring to FIG. 4A, a mask pattern 162 is formed to define the region where the long-exposure pixel $PX_{LB}$ will be formed over the first surface of the semiconductor substrate 110. That is, the mask pattern 162 may expose the region where the long-exposure pixel $PX_{LB}$ will be formed. In one example, the mask pattern 162 may include a photoresist pattern.

Subsequently, the semiconductor substrate 110 may be etched using the mask pattern 162 as an etch mask to form a trench 114c'. In this case, the depth of the trench 114c' may correspond to a difference between the depth of the trench 114c and the depth of the trench 114b shown in FIG. 3A.

Referring to FIG. 4B, after the mask pattern 162 is removed, a mask pattern 164 is formed to define regions where the long-exposure pixels $PX_{LB}$ and $PX_{LG}$ will be formed over the first surface of the semiconductor substrate 110. That is, the mask pattern 164 may be formed to expose the trench 114c' formed in the process of FIG. 4A and regions of the long-exposure pixels $PX_{LG}$.

Thereafter, the semiconductor substrate 110 may be etched using the mask pattern 164 as an etch mask to form trenches 114c'' and 114b'. In this case, the depth of the trench 114c'' may correspond to a difference between the depth of the trench 114c and the depth of the trench 114a shown in FIG. 3A, and the depth of the trench 114b' may correspond to a difference between the depth of the trench 114b and the depth of the trench 114a.

In other words, since the trench 114b' is formed after the trench 114c' is formed, the trench 114c' may be additionally etched to the extent corresponding to the depth of the trench 114b' during the process of forming the trench 114b'. In this way, the trench 114c'' is formed.

Referring to FIG. 4C, after the mask pattern 164 is removed, a mask pattern 166 is formed to define regions where the long-exposure pixels $PX_{LR}$, $PX_{LG}$, and $PX_{LB}$ will be formed over the first surface of the semiconductor substrate 110. That is, the mask pattern 166 may be formed to expose the trenches 114c'' and 114b' formed by the processes shown in FIG. 4B and the regions corresponding to the remaining long-exposure pixels ($PX_{LR}$).

Subsequently, the semiconductor substrate 110 may be etched to the depth of the trench 114a using the mask pattern 166 as an etch mask to form the trenches 114c, 114b, and 114a.

Figure 5A:
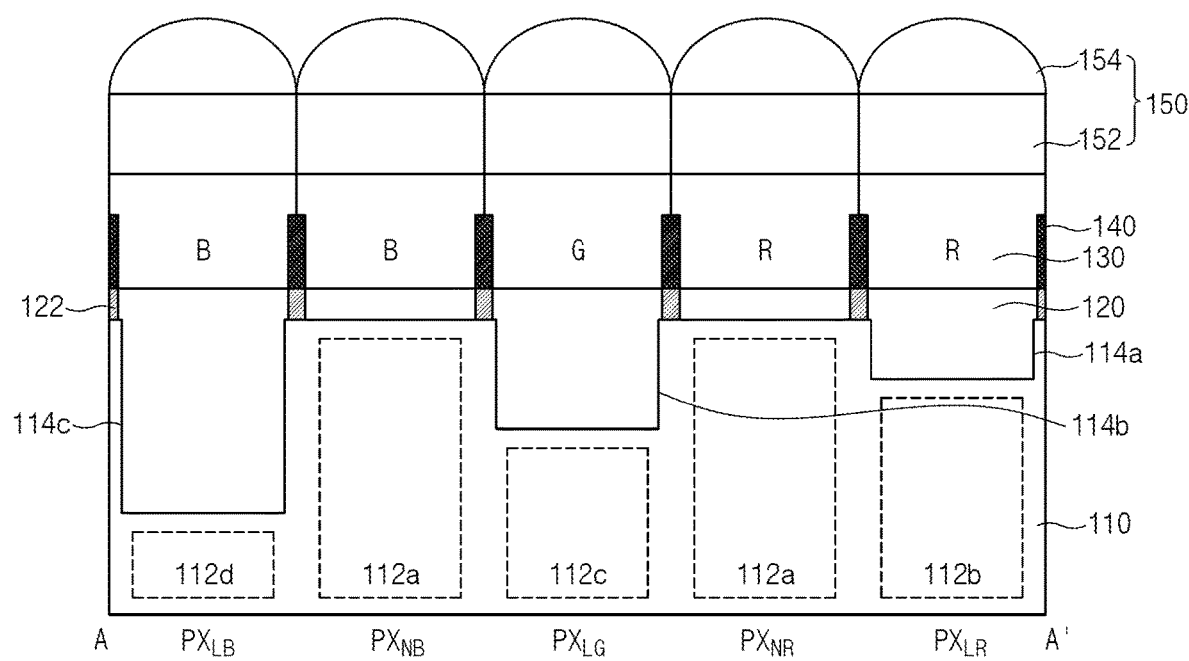
FIG. 5A is a cross-sectional view illustrating another example of a pixel array taken along the line A-A' shown in FIG. 2 based on some implementations of the disclosed technology.
Figure 5B:
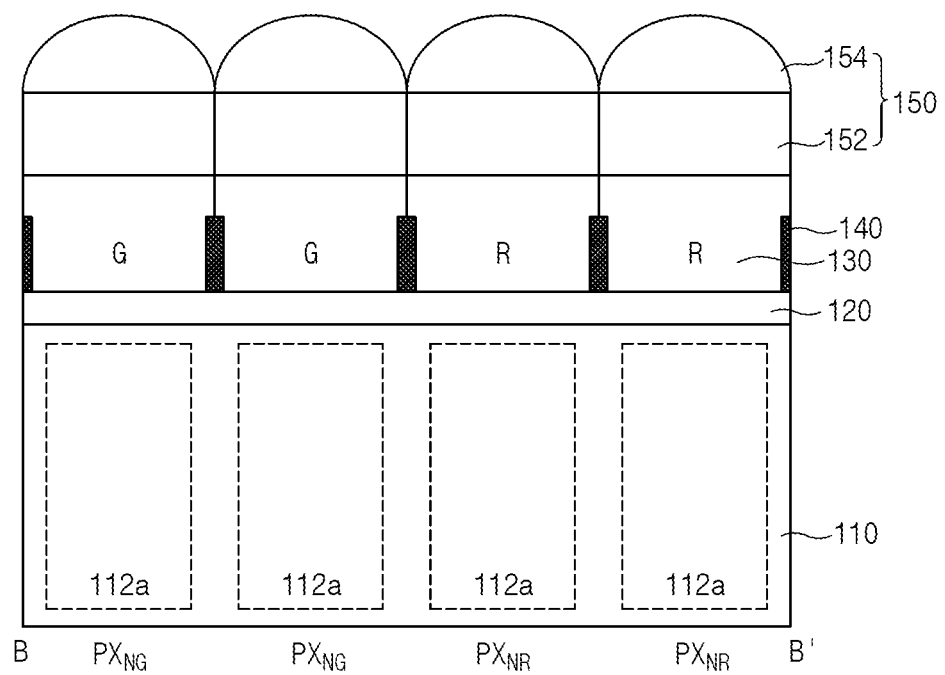
FIG. 5B is a cross-sectional view illustrating another example of a pixel array taken along the line B-B' shown in FIG. 2 based on some implementations of the disclosed technology.

FIG. 5A is a cross-sectional view illustrating another example of the pixel array 100 taken along the line A-A' shown in FIG. 2 based on some implementations of the disclosed technology. FIG. 5B is a cross-sectional view illustrating another example of the pixel array 100 taken along the line B-B' shown in FIG. 2 based on some implementations of the disclosed technology.

Referring to FIGS. 5A and 5B, a barrier film 122 may be additionally formed in each boundary region between the long-exposure pixels ($PX_{LR}$, $PX_{LG}$, $PX_{LB}$) and the normal pixels ($PX_{NR}$, $PX_{NG}$, $PX_{NB}$) in the anti-reflection layer 120. For example, the barrier film 122 may be formed in the anti-reflection layer 120 between the color filter layer 140 and the first surface of the semiconductor substrate 110, such that the barrier film 122 can vertically overlap with the grid structure 140 disposed between the long-exposure pixels ($PX_{LR}$, $PX_{LG}$, $PX_{LB}$) and the normal pixels ($PX_{NR}$, $PX_{NG}$, $PX_{NB}$). In this case, a top surface of the barrier film 122 may be in contact with a bottom surface of the grid structure 140, and a bottom surface of the barrier film 122 may be in contact with the first surface of the semiconductor substrate 110.

The barrier film 122 may prevent crosstalk caused by the anti-reflection layer 120 disposed between the long-exposure pixels ($PX_{LR}$, $PX_{LG}$, $PX_{LB}$) and the normal pixels ($PX_{NR}$, $PX_{NG}$, $PX_{NB}$). Here, the barrier film 122 may include a metal material.

As is apparent from the above description, the image sensing device based on some implementations of the disclosed technology can implement long-exposure pixels that have a different structure than other pixels to obtain long-exposure pixel signals and normal pixel signals without varying the exposure time. Accordingly, all pixels in such a sensor array can be controlled to operate with the same exposure time to obtain pixel signals from different structured pixels with different pixel saturation levels.

Although a number of illustrative embodiments have been described, it should be understood that various modifications to the disclosed embodiments and others embodiments can be devised based on what is described and/or illustrated in this patent document.

What is claimed is:

1. An image sensing device comprising:
a semiconductor substrate;
a plurality of photoelectric conversion elements supported by the semiconductor substrate and structured to convert light into electrical signals; and
a color filter layer disposed over the semiconductor substrate and structured to include different filters which filter incident light towards the photoelectric conversion elements depending on a wavelength range of the incident light corresponding to colors of the incident light to allow filtered incident light to be detected by the photoelectric conversion elements corresponding to the colors of the incident light,
wherein the color filter layer includes a plurality of first color filters as part of the different filters and structured to allow light at a wavelength range corresponding to a first color and arranged adjacent to each other, and wherein a distance between at least one of the first color filters and a corresponding photoelectric conversion element formed below the at least one of the first color filters is different from a distance between the remaining first color filters and corresponding photoelectric conversion elements, respectively.

2. The image sensing device according to claim 1, wherein:
the first color filters are arranged such that four of the first color filters are arranged in a 2×2 matrix.

3. The image sensing device according to claim 1, wherein the color filter layer further includes:
a plurality of second color filters structured to allow light at a wavelength range corresponding to a second color and arranged adjacent to each other; and
a plurality of third color filters structured to allow light at a wavelength range corresponding to a third color and arranged adjacent to each other.

4. The image sensing device according to claim 3, wherein:
a distance between at least one of the second color filters and a corresponding photoelectric conversion element formed below the at least one of the second color filters is different from a distance between the remaining second color filters and corresponding photoelectric conversion elements, respectively.

5. The image sensing device according to claim 3, wherein:
a distance between at least one of the third color filters and a corresponding photoelectric conversion element formed below the at least one of the third color filters is different from a distance between the remaining third color filters and corresponding photoelectric conversion elements, respectively.

6. The image sensing device according to claim 3, wherein the semiconductor substrate includes:
a first trench in which the at least one of the first color filters is formed;
a second trench in which the at least one of the second color filters is formed; and
a third trench in which the at least one of the third color filters is formed,
wherein the first trench, the second trench and the third trench have different depths from each other.

7. The image sensing device according to claim 1, further comprising:
an anti-reflection layer disposed between the photoelectric conversion elements and the color filter layer.

8. The image sensing device according to claim 7, wherein a portion of the anti-reflection layer corresponding to the at least one of the first color filters has a different thickness than portions of the anti-reflection layer corresponding to the remaining first color filters.

9. The image sensing device according to claim 1, further comprising:
an anti-reflection layer disposed between a first surface of the semiconductor substrate and the color filter layer.

10. The image sensing device according to claim 9, further comprising:
a barrier film disposed in the anti-reflection layer and structured to vertically overlap with a grid structure disposed between the at least one of the first color filters and the remaining first color filters.

11. An image sensing device comprising:
a first sub-pixel block including a plurality of unit pixels arranged adjacent to each other and structured to convert light at a wavelength range corresponding to a first color to electrical signals;
a second sub-pixel block including a plurality of unit pixels arranged adjacent to each other and structured to convert light at a wavelength range corresponding to a second color to electrical signals; and
a third sub-pixel block including a plurality of unit pixels arranged adjacent to each other and structured to convert light at a wavelength range corresponding to a third color to electrical signals,
wherein each of the first to third sub-pixel blocks includes at least one unit pixel that includes a photoelectric conversion element spaced apart from a corresponding color filter at a first distance and remaining unit pixels that include photoelectric conversion elements spaced apart from corresponding color filters at a second distance, and wherein the first distance is different from the second distance.

12. The image sensing device according to claim 11, wherein:
each of the first sub-pixel block, the second sub-pixel block and the third sub-pixel block includes four pixels of the same color arranged adjacent to each other in a 2×2 matrix array.

13. The image sensing device according to claim 11, wherein:
in each of the first sub-pixel block, the second sub-pixel block and the third sub-pixel block, the photoelectric conversion element of the at least one unit pixel has a thickness different from photoelectric conversion elements of the remaining unit pixels.

14. The image sensing device according to claim 11, wherein the first sub-pixel block includes:
a plurality of first normal pixels, each of which includes a first photoelectric conversion element having a first height; and
at least one first non-normal pixel including a second photoelectric conversion element having a second height lower than the first height.

15. The image sensing device according to claim 14, wherein the second sub-pixel block includes:
a plurality of second normal pixels, each of which includes a third photoelectric conversion element having the first height; and
at least one second non-normal pixel including a fourth photoelectric conversion element having a third height lower than the second height.

16. The image sensing device according to claim 15, wherein the third sub-pixel block includes:
a plurality of third normal pixels, each of which includes a fifth photoelectric conversion element having the first height; and
at least one third non-normal pixel including a sixth photoelectric conversion element having a fourth height lower than the third height.

17. The image sensing device according to claim 11, wherein:
the first sub-pixel block, the second sub-pixel block and the third sub-pixel block are arranged in a Bayer pattern.

18. The image sensing device according to claim 11, further comprising:
an anti-reflection layer disposed between the photoelectric conversion elements and a color filter layer.

19. The image sensing device according to claim 11, further comprising:
   an anti-reflection layer disposed over a first surface of a semiconductor substrate.

20. The image sensing device according to claim 19, further comprising:
   a barrier film formed in a boundary region between the at least one unit pixel and the remaining unit pixels other than the at least one unit pixel in the anti-reflection layer.

* * * * *